United States Patent
Winkens

(10) Patent No.: US 8,587,329 B2
(45) Date of Patent: Nov. 19, 2013

(54) CIRCUIT ARRANGEMENT FOR DETERMINATION OF A MEASURING CAPACITANCE

(75) Inventor: Frank Winkens, Ludwigshafen (DE)

(73) Assignee: Balluff GmbH, Neuhausen a.d.F. (DE)

(*) Notice: Subject to any disclaimer, the term of this patent is extended or adjusted under 35 U.S.C. 154(b) by 332 days.

(21) Appl. No.: 12/798,887

(22) Filed: Apr. 13, 2010

(65) Prior Publication Data

US 2010/0259284 A1    Oct. 14, 2010

(30) Foreign Application Priority Data

Apr. 14, 2009 (DE) .................. 10 2009 017 011

(51) Int. Cl.
*G01R 27/26* (2006.01)
*G01R 27/02* (2006.01)

(52) U.S. Cl.
USPC ........... 324/679; 324/606; 324/677; 324/658; 324/665

(58) Field of Classification Search
USPC ............. 324/335, 679; 73/304; 361/181, 191; 307/116; 340/562
See application file for complete search history.

(56) References Cited

U.S. PATENT DOCUMENTS

| | | | | |
|---|---|---|---|---|
| 3,379,972 A | * | 4/1968 | Foster et al. ................. | 324/662 |
| 3,458,803 A | * | 7/1969 | Maguire ...................... | 324/679 |
| 3,824,459 A | * | 7/1974 | Uchida ........................ | 324/678 |
| 4,459,541 A | * | 7/1984 | Fielden et al. ............... | 324/678 |
| 4,633,168 A | * | 12/1986 | Venema ....................... | 324/678 |
| 4,743,837 A | | 5/1988 | Herzog | |
| 4,831,325 A | * | 5/1989 | Watson, Jr. .................. | 324/678 |
| 5,291,139 A | * | 3/1994 | Fruhauf et al. .............. | 324/550 |
| 5,294,889 A | * | 3/1994 | Heep et al. .................. | 324/678 |

(Continued)

FOREIGN PATENT DOCUMENTS

| | | |
|---|---|---|
| DE | 1 673 841 | 6/1971 |
| DE | 35 44 187 | 6/1987 |

(Continued)

OTHER PUBLICATIONS

Dana G. Reed, Editor, The ARRL Handbook for Radio communications, 2005, The National Association for Amateur Radio Newington CT, 06111 USA, Eighty-Second Edition chapter 5, 5.32-5.36 and 5.15.*

(Continued)

*Primary Examiner* — Jermele M Hollington
*Assistant Examiner* — Christopher McAndrew
(74) *Attorney, Agent, or Firm* — Collard & Roe, P.C.

(57) ABSTRACT

The invention proposes a circuit arrangement for determination of a measuring capacitance (1), comprising a reference circuit portion for defined periodic charging and discharging of a predefined reference capacitance (1a), and a measuring circuit portion for defined periodic charging and discharging of the measuring capacitance (1) to be determined, and at least one circuit portion (4, 7; 4a, 7a) intended to determine at least one value ($M_2$) characteristic of the charging time curve of the reference capacitance (1a) and for deriving at least one value ($M_1$) characteristic of the charging time curve of the measuring capacitance (1), as well as a circuit portion (9) for comparing the at least one value ($M_2$) characteristic of the charging time curve of the reference capacitance (1a) with the at least one value ($M_1$) characteristic of the charging time curve of the measuring capacitance (1), and for deriving from that comparison the value of the measuring capacitance (1).

11 Claims, 5 Drawing Sheets

(56) References Cited

U.S. PATENT DOCUMENTS

| | | | |
|---|---|---|---|
| 5,329,239 A * | 7/1994 | Kindermann et al. | 324/678 |
| 6,194,903 B1 | 2/2001 | Schulz | |
| 6,404,222 B1 * | 6/2002 | Fan et al. | 324/762.02 |
| 6,664,661 B1 | 12/2003 | Palata et al. | |
| 6,828,794 B2 * | 12/2004 | Reavell et al. | 324/464 |
| 7,312,616 B2 * | 12/2007 | Snyder | 324/658 |
| 7,509,856 B1 | 3/2009 | Winkens et al. | |
| 8,384,400 B2 * | 2/2013 | Chou et al. | 324/679 |
| 2006/0186900 A1 * | 8/2006 | Shoji et al. | 324/679 |
| 2009/0158841 A1 | 6/2009 | Winkens | |
| 2009/0235738 A1 * | 9/2009 | Uhov | 73/304 C |
| 2011/0115502 A1 * | 5/2011 | Lin et al. | 324/679 |
| 2011/0187389 A1 * | 8/2011 | Han et al. | 324/679 |
| 2013/0076377 A1 * | 3/2013 | Chou et al. | 324/679 |
| 2013/0229224 A1 * | 9/2013 | Ho et al. | 327/517 |

FOREIGN PATENT DOCUMENTS

| | | |
|---|---|---|
| DE | 197 01 899 | 10/1997 |
| DE | 197 44 152 | 4/1999 |
| DE | 199 45 330 | 4/2001 |
| DE | 199 49 985 | 5/2001 |
| DE | 101 56 580 | 5/2003 |
| DE | 10 2005 057 558 | 6/2007 |
| EP | 1 093 225 | 4/2001 |

OTHER PUBLICATIONS

EMC immunity requirements, "International Standard," Part IEC 61000-4-6, Edition 2.2, May 2006. (Spec, p. 2).

Office Action dated Oct. 22, 2009 in German application 10 2009 017 011.1-35 with English translation of relevant part.

* cited by examiner

CIRCUIT ARRANGEMENT FOR DETERMINATION OF A MEASURING CAPACITANCE

CROSS REFERENCE TO RELATED APPLICATIONS

Applicant claims priority under 35 U.S.C. §119 of German Application No. 10 2009 017 011.1 filed Apr. 14, 2009.

BACKGROUND OF THE INVENTION

1. Field of the Invention

The present invention relates to a circuit arrangement for determination of a measuring capacitance.

2. Description of the Related Art

For measuring very small capacitance values or capacitance variations it has been known in the art, for example, to use capacitive proximity switches which have been known since the late sixties. They operate on the principle of influencing an alternating electric field by a dielectric of an object or a medium clearly greater than the dielectric of air or vacuum. Placing such a dielectric in the near field of one or more sensing electrodes leads to a corresponding concentration of electric field lines in that area and, accordingly, to amplification of the electric field. This has the effect to increase capacitance, for example of a plate capacitor in which the dielectric has been placed between its plates, by a small amount. That capacitance variation is evaluated in an evaluation circuit. The evaluation circuit emits a switching signal, for example, when the capacitance rises above a predefined value.

Such capacitive proximity switches are used for applications in the most diverse technical fields. Such applications include, for example, uses for monitoring limit levels of media of any kind, for example aqueous media, granulates, powders, oils and the like. They may be used in submerged condition for determining, for example, the filling level or, in a contactless way, for example by arranging them on the outside of a non-metallic wall of a container for determination of the filling level inside the container for example. Another application consists in scanning and detecting objects over a certain distance, for example in detecting a paper stack, a metallic object, a glass or the like.

Capacitive sensors are operated using electronic circuit arrangements whose functioning modes fall into two main groups, subdivided by their operating principles.

On the one hand, there are oscillating methods where as a rule the oscillating conditions of an oscillator, acting as a closed-loop amplifier, is controlled via an electrode system shortly before oscillation commences. In that case, the electrode system mostly is formed by a capacitive voltage divider, with the measuring capacitance as an integral component. The value of the measuring capacitance influences the overall amplification factor, the phase position and, thus, the oscillatory characteristics. Such oscillator circuits used for detecting small capacitance values and capacitance differences, intended for use in capacitive sensors, have been disclosed, for example, by DE 101 56 580 A1 or DE 1 673 841 A1. Such circuit arrangements and methods permit high sensitivity and/or switching intervals of the capacitive sensors and excellent "sensory qualities", such as compensation for adhering medium residues, to be achieved with little circuitry input. A disadvantage of such oscillating methods is seen, however, in high susceptibility to interference by alternating electric fields in a wider or narrower bandwidth around the oscillating frequency. Such sensors therefore in many cases fail to meet the EMC immunity requirements, Part IEC61000-4-6.

Other methods for operating the sensors, that exist in addition to the before-mentioned oscillating methods, may be described as "driven " methods where a generator controls a measuring circuit according to different principles, for example as capacitive bridges, oscillating amplifiers, charge-balancing methods, phase comparators, or the like.

Capacitive sensors that operate on that principle have been disclosed, for example, by DE 199 49 985 A1, DE 197 01 899 C2, EP 1 093 225 B1 or by DE 10 2005 057 558 A1. Although in many cases capacitive sensors that are operated in this way are less sensitive to inference voltage in a wide frequency spectrum it is, however, a disadvantage that such sensors can be realized only with considerably higher circuitry input and in most cases with poorer sensory quality. As used in the present application, the term "sensory quality" relates to the following values or properties:

- a large adjustable and usable sensitive range, i.e. a large span between the minimally and the maximally adjustable switching interval;
- little temperature dependence of the switching interval;
- the capability to compensate for wet, conductive adhering media, in the case of filling level applications;
- series stability, or independence from component variations.

Presently, there do not exist any capacitive sensors that provide those properties in combination with high EMC immunity. For example, the sensor for contactless detection of the filling level of a highly conductive liquid and adhering medium, such as blood, through a non-metallic container wall of a container, as described by DE 10 2005 057 558 A1, and the method disclosed by that publication actually provide for excellent compensation for adhering media in filling level applications, combined with high interference immunity. But on the other hand, that sensor and the method for contactless detection of the filling level of liquid media do not reach the high switching intervals required in distance sensor technology.

While the method for detection and evaluation of a capacitance variation disclosed by DE 199 45 330 A1, and the sensor described in that publication, permit, for example, high switching intervals to be achieved and high interference levels to be compensated, that sensor does not provide for compensation for adhering ionizing media.

SUMMARY OF THE INVENTION

Now, it is the object of the present invention to provide a circuit arrangement for determination of a measuring capacitance, especially for use in capacitive proximity switches, that meets all the before-mentioned requirements as to sensory qualities in an excellent way, while requiring little circuitry input and offering a high degree of immunity to interference.

That object is achieved by a circuit arrangement for determination of a measuring capacitance comprising a reference circuit portion for defined periodic charging and discharging of a predefined reference capacitance, and a measuring circuit portion for defined periodic charging and discharging of the measuring capacitance to be determined, and further comprising at least one circuit portion intended to determine at least one value characteristic of the charging time curve of the reference capacitance and for deriving at least one value characteristic of the charging time curve of the measuring capacitance, as well as a circuit portion for comparing the time curve of the value characteristic of the reference capacitance charging process with the time curve of the value characteristic of the measuring capacitance charging process, and for deriving from that comparison the value of the measuring capacitance.

The basic idea of the invention resides in dividing the circuit arrangement in two portions, a reference circuit portion and a measuring circuit portion, where the circuit portions show a symmetrical design, i.e. an identical, but mirrored structure, and each of the circuit portions periodically charges a reference capacitance or a measuring capacitance, respectively, and determines the time curve of a value characteristic of the charge of both the reference capacitance and the measuring capacitance. A further circuit portion then serves to determine the measuring capacitance, based on that comparison. Such a symmetrical structure of the reference circuit portion and the measuring circuit portion provides the important advantage that high immunity of the circuitry can be achieved, which is due to the fact that any interference, for example by temperature variations or the like, have the same effect on both portions of the circuitry, in which connection it should be noted that those circuit portions are arranged in the capacitive sensor in direct neighborhood one to the other so that, essentially, they are exposed to identical environmental conditions and any interference factors will have the same effect in the two parts of the circuitry.

Evaluation of the time curve of the value characteristic of the charge of both the reference capacitance and the measuring capacitance preferably is effected by comparing those values in the respective circuit portion. A switching signal is emitted every time the value characteristic of the charging time curve of the measuring capacitance corresponds to the time curve of the value characteristic of the charge of the reference capacitance. In that case the value of the measuring capacitance is equal to the value of the reference capacitance.

In principle, it would be imaginable to detect both the time curve of a value characteristic of the charge of the measuring capacitance and the time curve of a value characteristic of the charge of the reference capacitance in one and the same part of the circuitry. However, an especially simple implementation, in terms of circuit engineering, suggests to assign to each of the reference circuit portion and the measuring circuit portion a separate circuit part intended to determine the time curve of the value characteristic of the charge of the measuring capacitance and of the reference capacitance, respectively.

As regards the value characteristic of the charging time curve of the measuring capacitance or of the reference capacitance, respectively, one could in principle imagine the most diverse values that permit a conclusion to be drawn on the charging time curve of the measuring capacitance or the reference capacitance, respectively. According to an especially advantageous embodiment, the arithmetic time average or the direct-voltage content of the charging voltage of the measuring or the reference capacitance is taken as that value, for example.

According to an especially advantageous embodiment, charging or discharging of the reference capacitance and of the measuring capacitance occur periodically and in a cycle-controlled fashion so that simultaneous charging of the reference capacitance and the measuring capacitance occur in a first time interval of a period and simultaneous discharging of both the measuring capacitance and the reference capacitance occur in a second time interval of the period.

Preferably, it is provided in this case that the second time interval is considerably shorter than the first time interval so that charging occurs over a substantially longer period than discharging, which occurs abruptly. It is ensured in this way that the value of the arithmetic time average of the charging voltage of the measuring capacitance or the reference capacitance, respectively, or the common-mode content of the change signal for the charging and discharging operations of the measuring capacitance or the reference capacitance, assume higher values with the accompanying advantages related to the detection of such values. For detecting the time curve of the mean value of the charging voltage of the reference or the measuring capacitance, respectively, at least one RC element each is arranged in both the reference circuit portion and the measuring circuit portion. In case of a charging curve, i.e. an exponential function, an arithmetic time average can be easily formed using such an RC element.

The part of the circuitry intended to compare the mean values and to derive the measuring capacitance preferably consists of a comparator whose input receives the output signals of those parts of the circuitry that form the mean values.

In order to achieve simultaneous charging and discharging of both the measuring capacitance and the reference capacitance one embodiment provides that periodic charging and discharging is effected via a clock-pulse generator that drives a switch arrangement for simultaneously connecting to ground the reference capacitance and the measuring capacitance. As has been mentioned before, the time interval in which the reference capacitance or the measuring capacitance, respectively, are connected to ground is considerably shorter than the interval for which the switch arrangement is opened at any time, i.e. during which charging of the reference capacitance or the measuring capacitance occurs.

Preferably, the switch arrangement is realized using a diode network or junction FETs, which are especially sensitive to interference and which simultaneously provide very precise switching characteristics. Compared with integrated analog switches, such arrangements especially provide the advantage of little parasitic capacitance, which latter may be found, for example, in the circuit arrangement disclosed by DE 197 01 899 C2 that uses changeover switches, i.e. two switches with the resulting duplicated parasitic stress on the measuring capacitance.

An especially preferred arrangement provides that charging of the reference capacitance occurs via an adjustable voltage source, whereas charging of the measuring capacitance occurs via a fixed extra-low voltage source. This permits the switching interval for a capacitive sensor to be adjusted, as will be explained in more detail below.

Preferably, the reference circuit portion and the measuring circuit portion are arranged inside the same housing, in direct neighborhood one to the other, especially on the same printed board, in order to advantageously allow compensation of any linear interference, for example temperature influences or influences due to component drift, as those interference factors have the same effect on the two symmetrically arranged circuit portions.

BRIEF DESCRIPTION OF THE DRAWINGS

Further advantageous and features of the invention are the subject-matter of the description that follows and of the embodiments illustrated in the drawings.

In the drawings.

DETAILED DESCRIPTION OF PREFERRED EMBODIMENTS

Figure 1:
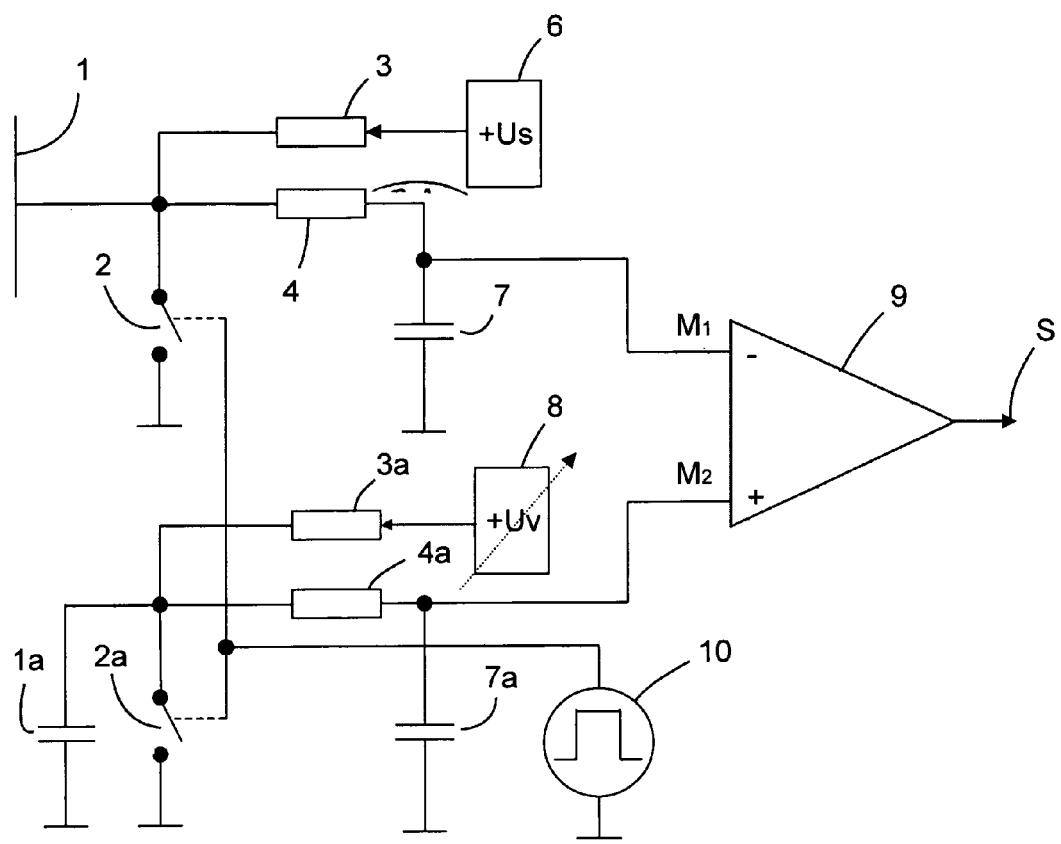
FIG. 1 shows a first embodiment of a circuit arrangement according to the invention.

A first embodiment of a circuit arrangement according to the invention is illustrated in FIG. 1. A square-wave generator 10 switches electronic switches 2, 2a periodically on for a period Ton, and off for a period Toff, at a control frequency 1/(Ton+Toff). During the period Ton a measuring capacitance or a measuring electrode 1, or a fixed reference capacitance 1a, respectively, are connected to a fixed potential, for example ground in this case, by the switches 2 and 2a, respectively. As a result, the measuring capacitance 1 and the reference capacitance 1a are discharged abruptly. At the end of that period Ton the switches 2 or 2a, respectively, open again. The capacitance 1 and 1a are charged via the respective associated resistors 3 and 3a, respectively. For this purpose, charging currents are supplied via a direct-voltage source $U_s$ 6, for example in the form of a stabilized internal sensor supply, and an adjustable direct-voltage source $U_v$ 8. The charging voltage on the capacitance 1 or 1a rises according to an exponential function, being the charging function of a capacitance. The voltage rise in this case is a direct function of the capacitance values, the values of the charging resistances and the charging currents and of the supply voltages. Suitable dimensioning of the system ensures that the maximum charging voltage $U_{Lend}$ will not be reached at the end of the time interval Toff before the capacitance has been abruptly discharged during the time interval Ton through closing of the switches 2 and 2a, respectively. Charging and discharging continues at the clock pulse supplied by the generator 10.

Figure 2:
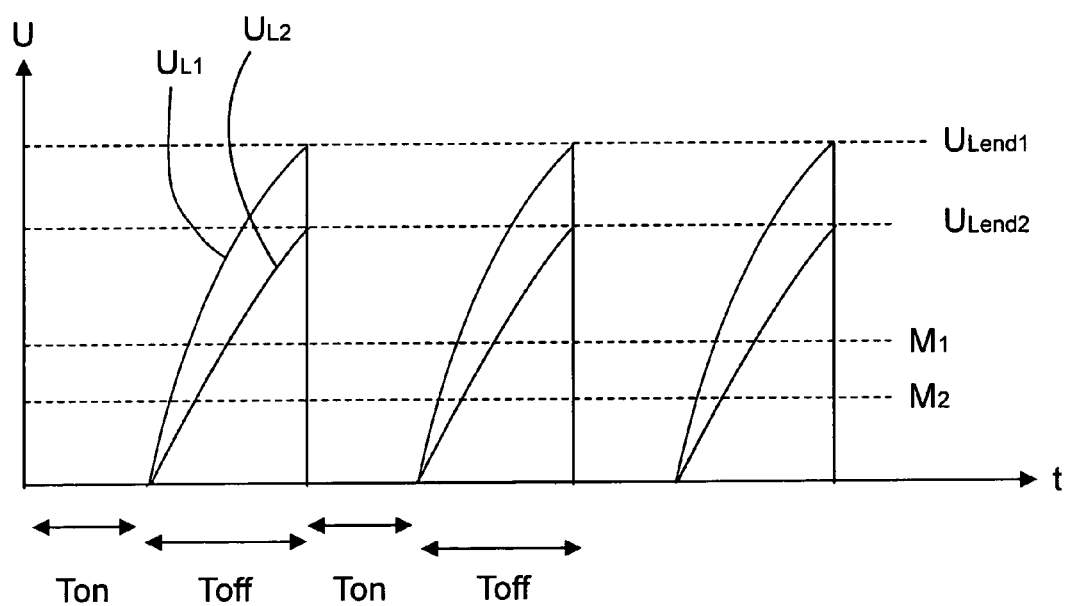
FIG. 2 shows a diagram of the charging voltages of the reference capacitance and the measuring capacitance, and their evaluation.

FIG. 2 shows a diagram of the signal curves. The periodic signal curves, developing on the capacitance in the form of voltages UL1, the charging voltage of the measuring capacitance, and UL2, the charging voltage of the reference capacitance, are used to derive the value of the measuring capacitance 1 in the manner that will be described hereafter. To this end, a mean value is formed of the charging voltages UL1 and UL2, respectively, of the measuring capacitance 1 or the reference capacitance 1a, respectively. That process is realized by the use of RC low-pass elements of the first order, constituted by resistors 4 or 4a, respectively, and capacitances 7 or 7a, respectively. The low-pass filter averages the periodic signal UL1, UL2, respectively, thus providing its DC-voltage content for further processing. Preferably, the resistance values 4 or 4a, respectively, should be five times higher than the resistance values 3 and 3a, respectively, to ensure perfect decoupling from the charging and discharging process.

Forming the mean value of the charging and the discharging curves of the two capacitances—measuring capacitance and reference capacitance—in this way is the basic idea of the invention. As can be seen in FIG. 2, where a mean value $M_1$ is assigned to the charging voltage $U_{L1}$ and a mean value $M_2$ is assigned to the charging voltage $U_{L2}$, the mean values and the direct-voltage content of the charging voltages, respectively, are clearly and reversibly assigned to the final charging voltages. Those signals $M_1$ and $M_2$ are supplied to a voltage comparator 9. The voltage at the "−" input is directly influenced by the variable being measured. It drops as the capacitance 1 rises, causing the charging voltage $U_{Lend1}$, and thus the mean value $M_1$, to drop. Once that signal at the "−" input of the comparator 9 drops below the signal $M_2$ of the mean value of the charging voltage of the reference capacitance, formed in the reference circuit portion and applied to the "+" input of the comparator 9, the comparator 9 breaks over from the low to the high state and emits, for example, a signal S indicative of the fact that a medium has been sensed, for example. The closer the mean value $M_2$ is to the mean value $M_1$, the lower is the limit value of the measuring capacitance 1 that causes the comparator 9 to break over. Sensitivity can be adjusted within a wide range via the adjustable direct voltage $U_v$, by the adjustable voltage source 8.

The reference circuit portion, which has a structure symmetrical, so to say mirrored, to the measuring circuit portion, is indicated in FIG. 1 by an "a" annexed to the respective reference numeral.

Due to the symmetrical, i.e. identical, structure of the two circuit portions, component-related drifts, such as temperature drifts or drifts due to aging of the components, will occur equally in both branches. Equal drifts in both branches insofar result in a theoretical differential voltage equal to zero. Accordingly, drift phenomena are largely eliminated. The circuit arrangement therefore shows very little temperature dependence so that very high sensitivity can be reached. The sensory quality of the described circuit arrangement is substantially determined by the characteristics of the electronic switches 2 and, especially, by their parasitic capacitance. The switches can be implemented at low cost, with the aid of junction FETs or diode networks. The high immunity to interference results from the fact that in a linear system many signals can be superimposed one to the other without being disturbed. With the switch 2 in open condition, during the time interval Toff, only resistors, i.e. linear components, are connected to the electrode 1. The mean value of decoupled interference voltages, downstream of the RC low-pass filters 4, 7 or 4a, 7a, respectively, is always equal to zero. This is so on the condition that the electronic switch arrangement 2, 2a does not limit high interference voltage excursions at the electrode connection, in the open condition. This is achieved by sufficiently high reverse voltage in a diode switch network or by the use of junction FETs that have a negative reverse voltage. During the time interval Ton, the measuring electrode 1 is connected to the fixed potential so that it cannot be disturbed in that period of time.

Figure 3:
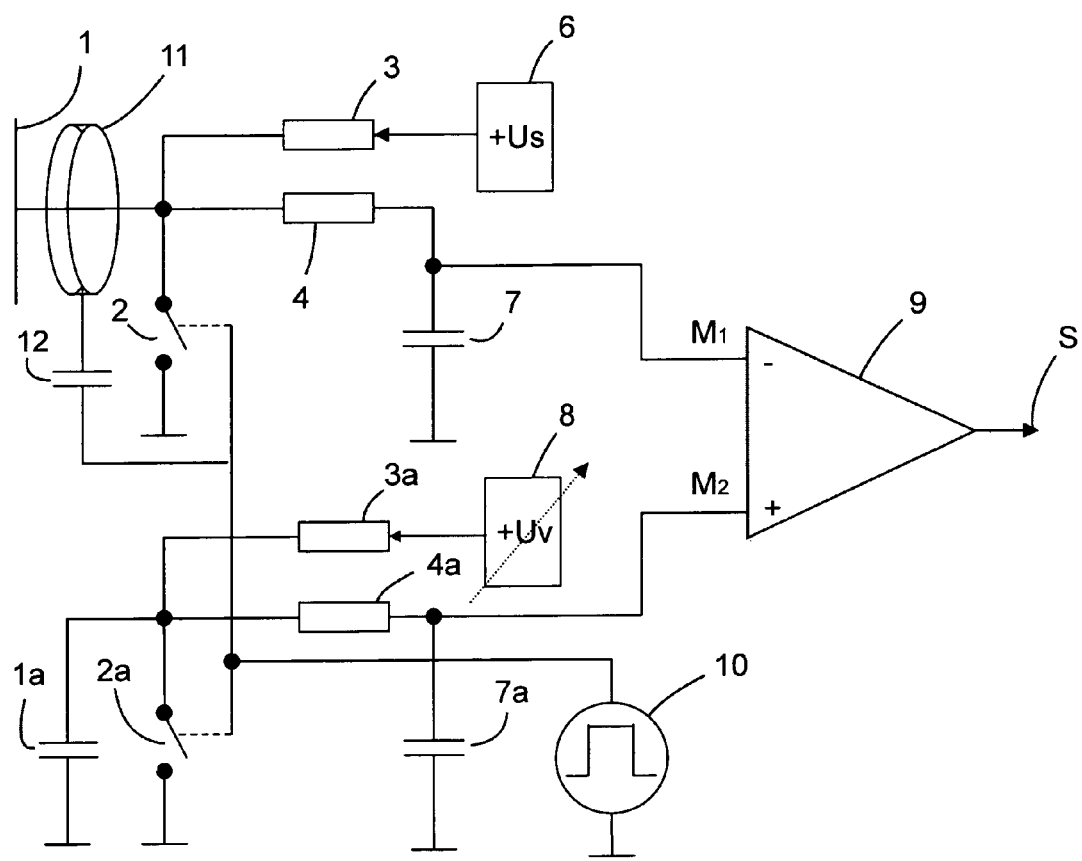
FIG. 3 shows a second embodiment of a circuit arrangement according to the invention.

Another embodiment of the circuit arrangement will be described hereafter with reference to FIG. 3 where elements identical to those used in FIG. 1 are indicated by the same reference numerals, and accordingly the description of FIG. 3 refers in full to the above explanations. The circuit arrangement of FIG. 3 differs from that of FIG. 2 in that the measuring electrode 1 is enclosed by an annular compensation electrode 11. That compensation electrode 11 serves to minimize any interfering influences on the measuring electrode 1 that may be produced by capacitive influences, for example of a plastic housing in which the circuit arrangement and the sensor are disposed. The compensation electrode 11 insofar counteracts, by a compensating alternating field, any interfering influences, for example residues of a medium adhering to the sensor housing after the system has been dipped into and withdrawn from the medium for level scanning. That circuit arrangement is used especially in free zones.

Figure 4:
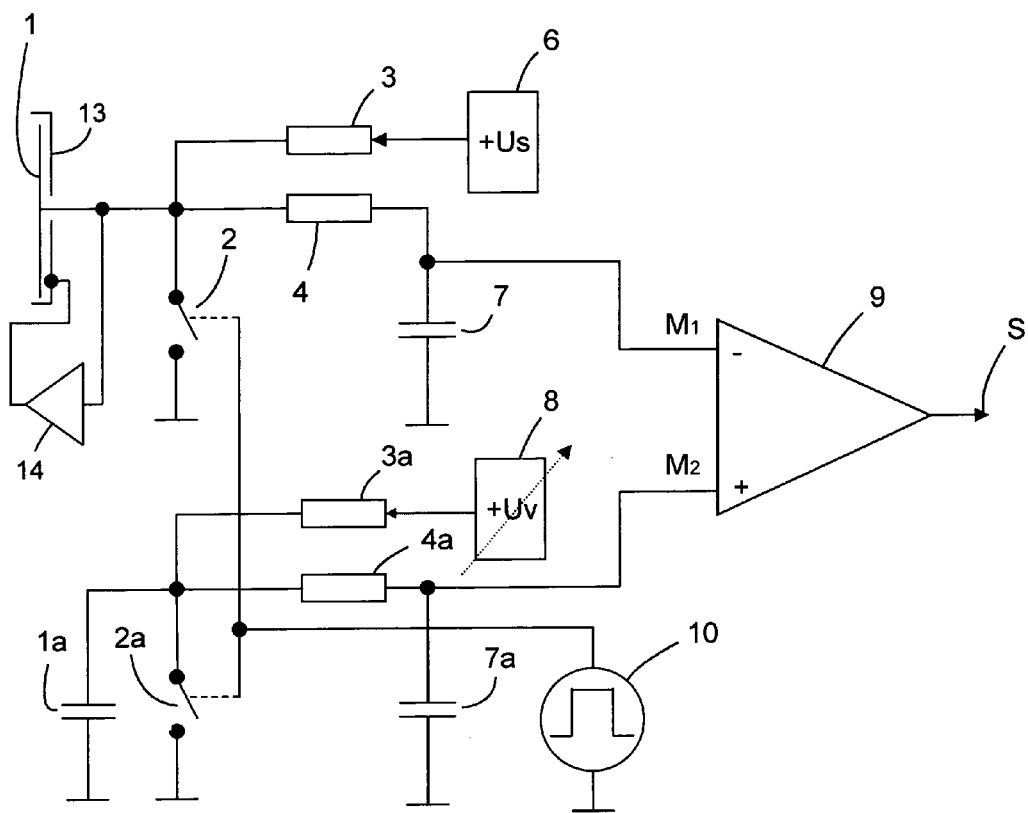
FIG. 4 shows a third embodiment of a circuit arrangement according to the invention.

The embodiment illustrated in FIG. 4 differs from that illustrated in FIG. 1 in that the measuring electrode 1 is enclosed by a shielding electrode 13. Here again, identical elements are indicated by the same reference numerals as in FIG. 1 so that the description refers to the above explanations. The shielding element 13 serves to shield the measuring electrode 1 from the rear so that, accordingly, it is arranged immediately on the rear of the measuring electrode or in a way enclosing the measuring electrode at its rear. The shielding electrode 13 is buffered by a non-inverting amplifier 14, having a voltage amplifying factor 1 and an input of the highest possible impedance and an output of the lowest possible impedance.

Figure 5:
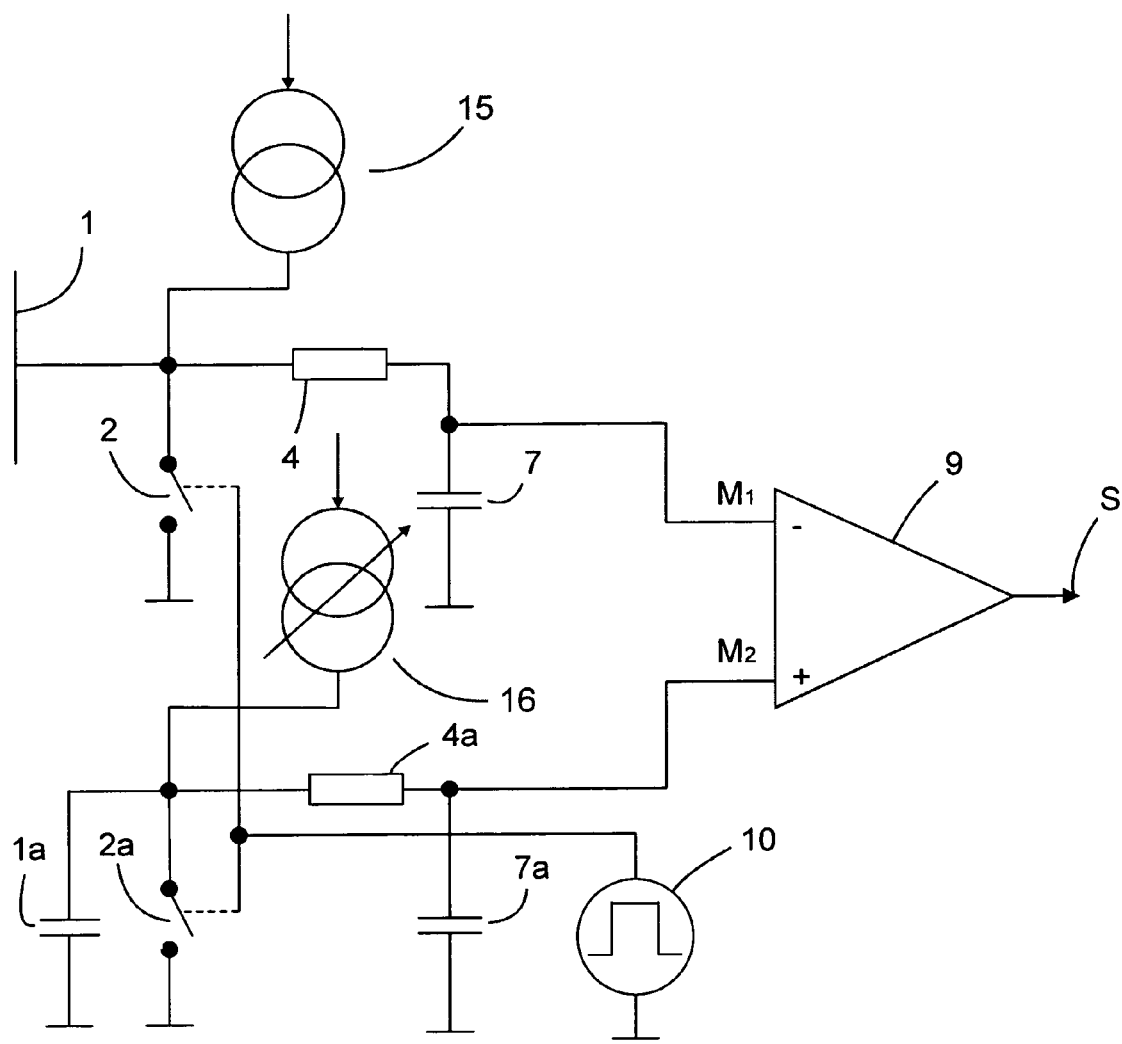
FIG. 5 shows a further embodiment of a circuit arrangement according to the invention.

Another embodiment of the circuit according to the invention is illustrated in FIG. 5, where identical elements are again indicated by the same reference numerals as in FIG. 1 and in FIG. 2, and accordingly reference is made to the above explanations in the description that follows. The circuit arrangement illustrated in FIG. 5 differs from that illustrated in FIGS. 1 to 4 in that a fixed d.c. source 15 is provided instead of the voltage source 6 and the resistor 3, and an adjustable d.c. source 16 is provided instead of the voltage source 8 and the resistor 3a. In the case of that circuit arrangement, charging of the measuring capacitance 1 and of the reference capacitance 1a, respectively, occurs via those constant current sources 15 and 16 linearly over time, not according to an exponential function.

In addition, it should be noted that the circuit arrangements that have been described above may also be designed with all polarities exchanged, which means that during the period Toff the capacitance 1 and 1a could also be discharged, for example by negative voltage sources 6 or 8 or current sinks, instead of the constant current sources 15 and 16, and could be recharged abruptly to a positive value during a period Ton. The before-mentioned principle of the invention can be realized in this way as well.

Although only a few embodiments of the present invention have been shown and described, it is to be understood that many changes and modifications may be made thereunto without departing from the spirit and scope of the invention.

The invention claimed is:

1. A circuit arrangement for determination of a measuring capacitance, the circuit arrangement comprising:
   a) a measuring circuit portion comprising:
      a measuring capacitance;
      a first fixed potential;
      a first voltage source coupled to said measuring capacitance via a first resistor for charging said measuring capacitance; and
      a first switch arrangement formed by a diode network or by junction FETs, wherein said measuring capacitance is coupled to said first voltage source to charge said measuring capacitance when said first switch arrangement is in an open state and said measuring capacitance is coupled to said first fixed potential to discharge said measuring capacitance when said first switch arrangement is in a closed state;
   b) a reference circuit portion comprising:
      a predefined reference capacitance;
      a second fixed potential;
      a second voltage source coupled to said reference capacitance via a second resistor for charging said reference capacitance; and
      a second switch arrangement formed by a diode network or by junction FETs, wherein said reference capacitance is coupled to said second voltage source to charge said reference capacitance when said second switch arrangement is in an open state and said reference capacitance is coupled to said second fixed potential to discharge said reference capacitance when said second switch arrangement is in a closed state;
   c) a square wave generator coupled to said first switch arrangement and said second switch arrangement, wherein said square wave generator is configured to simultaneously switch said first switch arrangement and said second switch arrangement to said open state for a first time interval and then simultaneously switch said first switch arrangement and said second switch arrangement to said closed state for a second time interval at a constant frequency equal to the reciprocal of the sum of said first time interval and said second time interval, thereby generating a first periodic signal comprising a time curve of a charging voltage of said measuring capacitance and a second periodic signal comprising a time curve of a charging voltage of said reference capacitance;
   d) a first low-pass filter of a first order directly coupled to said measuring capacitance, wherein said first low-pass filter is configured to form an arithmetic mean value of said first periodic signal;
   e) a second low-pass filter of a first order directly coupled to said reference capacitance, wherein said second low-pass filter is configured to form an arithmetic mean value of said second periodic signal; and
   f) a comparator having a first input coupled to said first low-pass filter to receive said arithmetic mean value of said first periodic signal and a second input coupled to said second low-pass filter to receive said arithmetic mean value of said second periodic signal, wherein said comparator is configured to emit a signal when said arithmetic mean value of said first periodic signal drops below said arithmetic mean value of said second periodic signal.

2. The circuit arrangement as defined in claim 1, wherein the first time interval differs from the second time interval.

3. The circuit arrangement as defined in claim 2, wherein the first time interval is greater than the second time interval.

4. The circuit arrangement as defined in claim 1, wherein a limit frequency of the first low-pass filter and the second low-pass filter is smaller than clock-pulse frequency of the square wave generator.

5. The circuit arrangement as defined in claim 1, wherein charging of the reference capacitance is effected via an adjustable voltage source and wherein charging of the measuring capacitance is effected via a fixed direct-voltage source.

6. The circuit arrangement as defined in claim 5, wherein a fixed d.c. source is provided instead of the first voltage source and the first resistor, and wherein an adjustable d.c. source is provided instead of the second voltage source and the second resistor and wherein charging of the measuring capacitance and of the reference capacitance is effected linearly in time via those constant current sources, respectively.

7. The circuit arrangement as defined in claim 1, wherein an annular compensation electrode is arranged in the immediate neighborhood of the measuring capacitance, which is charged and discharged together with the measuring capacitance periodically and in a cycle-controlled fashion.

8. The circuit arrangement as defined in claim 1, wherein for shielding the measuring capacitance at its rear, a shielding electrode is arranged in the immediate neighborhood of the measuring capacitance, at its rear, which is buffered by a non-inverting amplifier having a voltage amplifying factor 1 and a high-impedance input and a low-impedance output.

9. The circuit arrangement as defined in claim 1, wherein all parts of the circuit are arranged in a single housing.

10. The circuit arrangement as defined in claim 1, wherein the reference circuit portion and the measuring circuit portion have a symmetrical design one relative to the other.

11. The circuit arrangement as defined in claim 1, wherein said first low-pass filter comprises a first-low pass filter resistor having a resistance value five times higher than a resistance value of said first resistor and wherein said second low-pass filter comprises a second low-pass filter resistor having a resistance value five times higher than a resistance value of said second resistor.

* * * * *